(12) United States Patent
Yao et al.

(10) Patent No.: US 7,604,912 B2
(45) Date of Patent: Oct. 20, 2009

(54) LOCAL FLARE CORRECTION

(75) Inventors: Teruyoshi Yao, Kawasaki (JP); Satoru Asai, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 491 days.

(21) Appl. No.: 11/147,213

(22) Filed: Jun. 8, 2005

(65) Prior Publication Data

US 2005/0225736 A1 Oct. 13, 2005

Related U.S. Application Data

(63) Continuation of application No. PCT/JP03/06833, filed on May 30, 2003.

(51) Int. Cl.
    G03C 5/00 (2006.01)
    G03F 1/00 (2006.01)
    G03B 27/68 (2006.01)
    G06K 9/00 (2006.01)
    G06F 17/50 (2006.01)
    H01L 21/00 (2006.01)

(52) U.S. Cl. .............................. 430/30; 430/5; 430/311; 716/20; 355/52; 382/144

(58) Field of Classification Search .................. 430/30, 430/311, 5; 355/52; 382/144
    See application file for complete search history.

(56) References Cited

U.S. PATENT DOCUMENTS 5,538,833 A * 7/1996 Ferguson et al. ............ 430/325
6,233,056 B1 * 5/2001 Naulleau et al. ............ 356/520
6,835,507 B2 12/2004 Ki et al.
2001/0017693 A1 * 8/2001 Zheng et al. .................. 355/77
2003/0068565 A1 4/2003 Ki et al.

FOREIGN PATENT DOCUMENTS

| JP | 2001-222097 | 8/2001 |
| JP | 2002-353130 | 12/2002 |
| JP | 2003-100624 | 4/2003 |
| KR | 2003-0014098 | 2/2003 |

OTHER PUBLICATIONS

Office Action dated Oct. 30, 2006 issued in corresponding Korean Application No. 10-2005-7010310.
Patent Abstracts of Japan, publication No. 2001272766 A, published on Oct. 5, 2001.
Chinese Office Action mailed Jan. 9, 2009.

* cited by examiner

*Primary Examiner*—Mark F Huff
*Assistant Examiner*—Jonathan Jelsma
(74) *Attorney, Agent, or Firm*—Fujitsu Patent Center

(57) ABSTRACT

A correction of a local flare generated at a time of exposure when manufacturing a semiconductor device, wherein a substantial numerical aperture to a pattern in a region to be exposed is calculated for the each region, after that, the flare correction amount for the pattern in the each region is adjusted in conformity with the substantial numerical aperture and exposure conditions in the each region. Backed by this, the effect of the local flare on the pattern exposed by photolithography can be quantitatively corrected in conformity with the respective exposure conditions, so that a desired pattern can be formed readily and accurately.

20 Claims, 14 Drawing Sheets

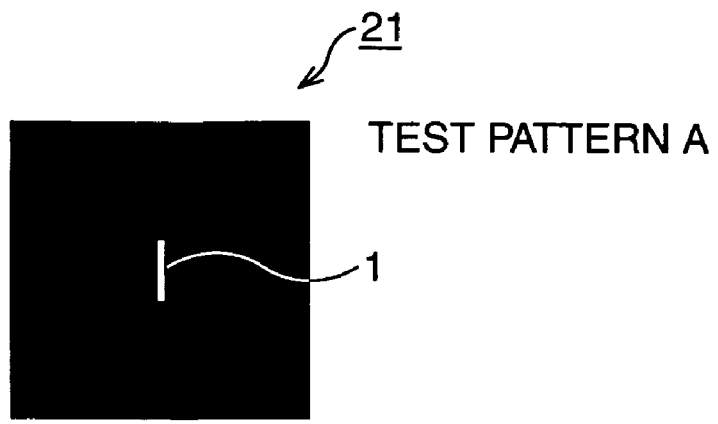
FIG. 4A  TEST PATTERN A
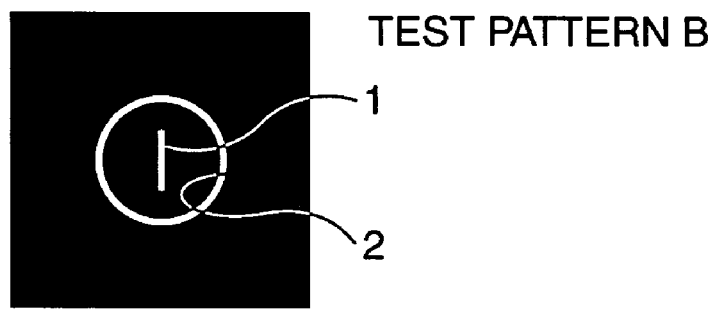
FIG. 4B  TEST PATTERN B
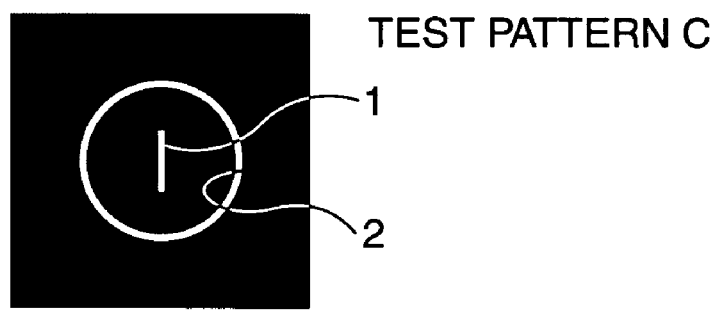
FIG. 4C  TEST PATTERN C
⋮
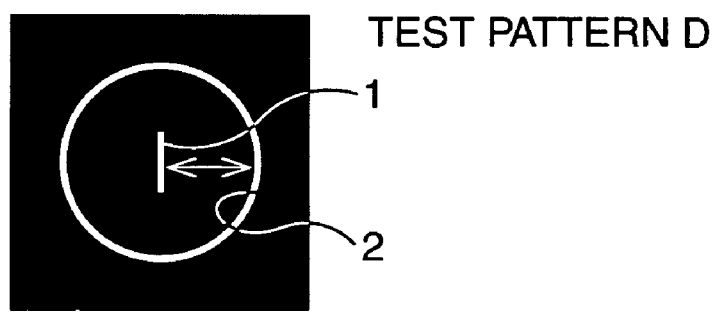
FIG. 4D  TEST PATTERN D

LOCAL FLARE CORRECTION

This application is a continuation of international application PCT/JP2003/006833 filed on May 30, 2003.

TECHNICAL FIELD

The present invention relates to a flare correction method of an aligner, a flare correction apparatus, and a photomask manufacturing method, which are used in a lithography process being one of manufacturing processes of a semiconductor device.

BACKGROUND ART

Recently, when forming a variety of patterns in semiconductor elements, projection aligners of a dioptric or catadioptric system are being used, however, a light having an optical path different from a design is generated due to reflection or scattering on a surface or inside of a lens, mask, projection lens, or the like of an illumination optical system, nonuniformity of a refractive index of lens materials thereof, or so forth. This is a phenomenon called a flare.

In recent days, the semiconductor devices are demanded for further microfabrication and higher integration, and along therewith, the projection aligners are progressively adopting a light of a shorter wave length. Specifically, the exposure light of a wave length of 193 nm is being adopted. However, due to a specialty of the lens applicable to such a short wave length light, a local flare is generated depending on an exposure pattern, and is therefore becoming to be recognized as a problem. This is a so-called local flare to be a main factor causing an unexpected variation in the shape or line width of the transferred pattern. The affecting range of the local flare due to a predetermined pattern on a photomask is within about 50 μm from the pattern. However, the affecting range of the local flare may vary in the future depending on the generation of the projection aligner and the wave length of the exposure light. Further, the local flare affects variously depending on a numerical aperture around the periphery of the pattern, and thereby affects differently on each position on the photomask. Hence, the level of the line width variation in a resist pattern differs depending on the position. It is, therefore, extremely difficult to correct the pattern of the photomask in consideration of the effect of the local flare.

FIG. 18 schematically shows how the local flare is generated. To a pattern that is transferred by exposing any point "A" on a photomask, local flares generated from lights transmitted through any regions "B", "C" being away from the point "A" is irradiated.

Patent Document 1

Japanese Patent Application Laid-Open No. 2001-272766

In order to form respective desired patterns in the semiconductor device favorably, the above-described local flare should be removed by way of quantification, however, this problem has begun to be closely watched just recently as previously described, and, therefore, no favorable approach has not been conceived yet to purposefully bring a solution specifically to the local flare, at present.

It is therefore an object of the present invention to provide a flare correction method, a photomask manufacturing method, and a flare correction apparatus to form a desired pattern readily and accurately by quantitatively correcting the effect of the local flare on the pattern exposed by photolithography in conformity with respective exposure conditions.

SUMMARY OF THE INVENTION

After due diligent efforts, the present inventors have devised embodiments as will be described below.

A flare correction method according to the present invention is the flare correction method correcting a local flare generated at a time of exposure when manufacturing a semiconductor device, comprising the steps of: calculating a substantial numerical aperture to a pattern in a region, for the each region to be exposed; and calculating a correction amount of the flare of the pattern in conformity with the substantial numerical aperture of the each region and a dependence of the flare correction amount.

A flare correction method according to the present invention is the flare correction method correcting a local flare generated at a time of exposure when manufacturing a semiconductor device, comprising the steps of: calculating, in each region to be exposed, a point spread function of the flare by using an experimental mask to estimate the flare, on a basis of a measurement result of the experimental mask and in conformity with exposure conditions of the each region; and calculating, for the each region to be exposed, a substantial numerical aperture to a pattern in the each region based on a light intensity distribution of the flare; and calculating a flare correction amount for the pattern in the each region in conformity with the substantial numerical aperture of the each region.

A manufacturing method of a photomask according to the present invention is the manufacturing method of the photomask having an exposure pattern to be transferred by lithography, comprising the steps of: calculating a substantial numerical aperture to a pattern in a region, for the each region to be exposed; calculating a correction amount of the flare generated at a time of exposure for the pattern in the each region, in conformity with the substantial numerical aperture of the each region and a dependence of the flare correction amount; and forming the exposure pattern based on the calculated correction amount.

A manufacturing method of a photomask according to the present invention is the manufacturing method of the photomask having an exposure pattern to be transferred by lithography, comprising the steps of: calculating, in each region to be exposed, a point spread function of the flare by using an experimental mask to estimate a local flare generated when transferring the exposure pattern, on a basis of a measurement result of the experimental mask and in conformity with exposure conditions of the each region; and calculating, for the each region to be exposed, a substantial numerical aperture to a pattern in the each region based on a light intensity distribution of the flare; calculating a flare correction amount for the pattern in the each region in conformity with the substantial numerical aperture of the each region; and forming the exposure pattern based on the calculated correction amount.

A flare correction apparatus according to the present invention is the flare correction apparatus correcting a local flare generated at a time of exposure when manufacturing a semiconductor device comprising: a point spread function calculator calculating, in each region to be exposed, a point spread function of the flare by using an experimental mask to estimate the flare, on a basis of a measurement result of the experimental mask and in conformity with exposure conditions of the each region; a substantial numerical aperture calculator calculating, for the each region to be exposed, a substantial numerical aperture to a pattern in the each region based on a light intensity distribution of the flare; and a flare correction amount calculator calculating a flare correction amount for the pattern in the each region in conformity with the substantial numerical aperture of the each region.

A program according to the present invention is to let a computer implement, in a correction of a local flare generated at a time of exposure when fabricating a semiconductor device, the steps of: calculating, in each region to be exposed, a point spread function of the flare by using an experimental mask to estimate the flare, on a basis of a measurement result of the experimental mask and in conformity with exposure conditions of the each region; and calculating, for the each region to be exposed, a substantial numerical aperture to a pattern in the each region based on a light intensity distribution of the flare; and calculating a flare correction amount for the pattern in the each region in conformity with the substantial numerical aperture of the each region.

A record medium according to the present invention is a computer-readable record media in which the program is recorded.

A program according to the present invention is to let a computer implement, in a fabrication of a photomask having an exposure pattern to be transferred by photography, the steps of: calculating, in each region to be exposed, a point spread function of the flare by using an experimental mask to estimate the flare generated when transferring the exposure pattern, on a basis of a measurement result of the experimental mask and in conformity with exposure conditions of the each region; and calculating, for the each region to be exposed, a substantial numerical aperture to a pattern in the each region based on a light intensity distribution of the flare; calculating a flare correction amount for the pattern in the each region in conformity with the substantial numerical aperture of the each region; and forming the exposure pattern based on the calculated correction amount.

A record medium according to the present invention is a computer-readable record media in which the program is recorded.

BRIEF DESCRIPTION OF THE DRAWINGS

FIGS. 4A to 4D are schematic views respectively showing a schematic configuration of an experimental photomask according to the present invention;

DETAILED DESCRIPTION OF THE PREFERRED EMBODIMENTS

Basic Gist of Present Invention

First, a description will be given of a basic gist of the present invention.

On the basis of an acquired knowledge that the effect of a local flare on a pattern differs depending on the distance from a region transmitting an exposure light and existing in the vicinity of the pattern, the present inventors have conceived, in an effort to recognize the local flare quantitatively, to make use of an experimental pattern to be a subject to estimate the effect of the local flare and flare generating patterns provided around the periphery of the experimental pattern to purposely generate the local flare to the experimental pattern.

Figure 1:
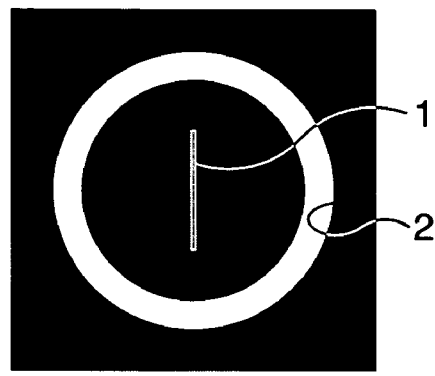
FIG. 1 is a schematic view theoretically showing an example test pattern in a flare evaluation apparatus according to the present invention.
Figure 2A:
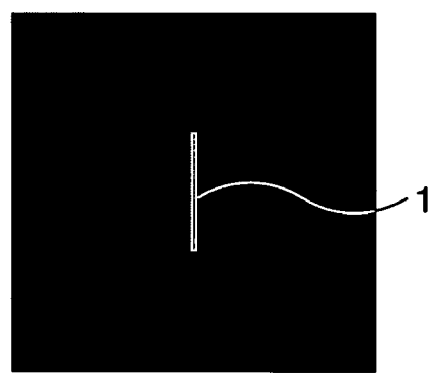
FIGS. 2A and 2B are schematic views theoretically showing an example test pattern, respectively, in the flare evaluation apparatus according to the present invention.
Figure 2B:
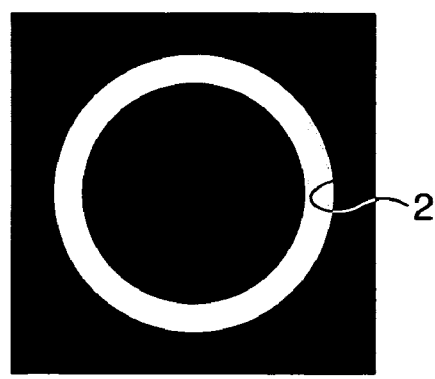

Specifically, as shown in FIG. 1, there are used a line pattern 1 to be measured and a zone pattern 2 of an orbicular zone shape surrounding the line pattern 1 to be the flare generating pattern that forms the light transmitting region to cause the local flare to the line pattern 1. Here, a black portion indicates a region shielding the exposure light and a white portion indicates a region transmitting the exposure light, respectively. In this case, for example, measurements are made to the cases where only the line pattern 1 as shown in FIG. 2A is exposed, and where a plurality of zone patterns 2 (only one is shown in the drawing) formed by the light transmitting region and having different diameters are prepared as shown in FIG. 2B, and the line pattern 1 and the respective zone patterns 2 are exposed multiple times. After the respective measurements, for example, the line widths of the line pattern 1 in the case of the double exposure are compared to that of the single exposure for the purpose of quantifying the effect of the local flare by recognizing the effect of the local flare as a variation in the line widths.

In this regard, the Patent Document 1 discloses an invention in which a pattern to be measured is provided in an aperture, and the relation between the distance from the pattern to be measured to the aperture and the coverage of a light-shielding portion of the aperture is measured in order to evaluate the effect of a stray light in the aligner. However, the object of the invention is not to evaluate the local flare but to evaluate the stray light to the end, and therefore the invention adopts a configuration and method suitable therefor. In order to quantify the effect of the local flare accurately, it is required to grasp the effect not in the aperture provided with the pattern to be measured, but from the aperture existing in the vicinity of the pattern to be measured, and it is therefore required to recognize the relation between the pattern to be measured and such an aperture (corresponding to the flare generating pattern) by seeing the distance between the both as a parameter as in the case of the present invention.

As described above, by estimating the local flare beforehand by using the experimental mask, it is possible to correct the local flare when forming an actual pattern. In this local flare evaluation method, however, as major parameters in the local flare evaluation, there are used the line width of the pattern to be measured, the distance from the pattern to be measured to the local flare generating pattern, and the region of the aperture of the flare generating pattern, hence, it is considered to be practically difficult to respond to a variety of types of photolithography one by one.

The present inventors have found that, even when forming a substantially the same actual pattern in the substantially the same exposure region, as an example, the generated local flare amount is different under different exposure conditions such as the number of exposure times to the region and the type of photomask. Further, even when the exposure conditions are the same, there may be a case where the local flare correction amount is different depending on the shape, the surrounding environments, or the like of the mask pattern to which an attention is paid (these factors are also considered additionally to the exposure conditions). The difference of the local flare correction amount depending on the exposure conditions becomes apparent for example when performing double exposure to form a gate electrode of a width narrower than that of a gate wiring in the formation of a gate of a transistor. Accordingly, the present invention aspires to additionally include such exposure conditions as a parameter to evaluate the local flare, so that more accurate local flare evaluation can be brought about.

When forming the gate by patterning based on double exposure, the gate electrode of the gate to be exposed doubly is formed in an active region and the gate wiring to be exposed once is formed in the remaining region (including on an element isolation region), therefore, the correction for the region other than the active region can be made simply based on a previously-measured local flare evaluation value, and the correction for the active region can be made based on the local flare evaluation value by adding an previously measured correction value being inherent to double exposure thereto.

Specific Embodiments

Hereinafter, specific embodiments will be described based on the above-described basic gist of the present invention.

In the present embodiment, there will be disclosed a specific approach in which a local flare is quantitatively evaluated using an experimental photomask provided with a test pattern to obtain a correction value, and further the correction value is adjusted on the basis of whether the portion to be exposed is exposed once or twice.

(Basic Configuration of Applying Local Flare Correction Method to Gate Formed by Double Exposure Technique)

First, a typical scene adopting the present invention, namely a gate formation by double exposure technique will be described.

Figure 3A:
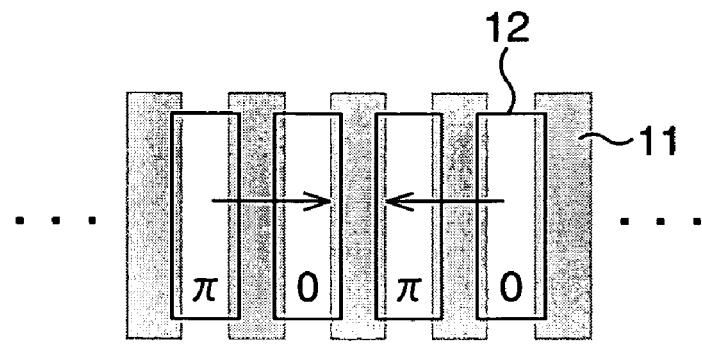
FIGS. 3A to 3C are schematic views respectively showing an example pattern of a photomask used in an exposure process of a gate.
Figure 3B:
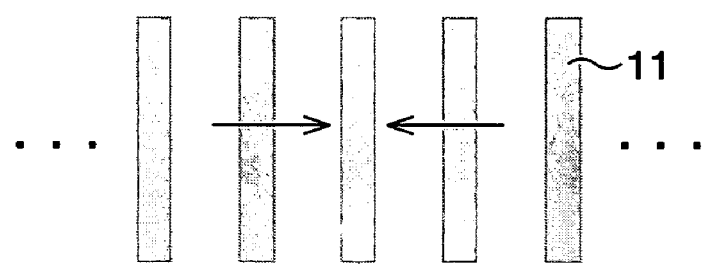
Figure 3C:
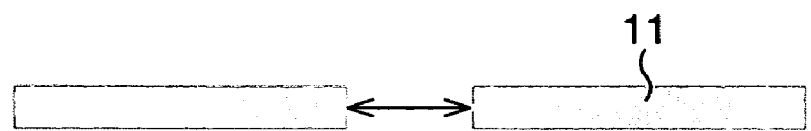

FIGS. 3A to 3C are schematic views showing examples of the photomask patterns used in the exposure process of the gate.

Here, two types of masks, namely a halftone type phase shift mask 11 (shown as blackened portions in the drawings) and a Levenson type phase shift mask 12 (shown by a solid line in the drawings), are used. FIG. 3A shows a gate electrode pattern formed by double exposure using these two types of photomasks, FIG. 3B show a gate wiring pattern formed using only the halftone type phase shift mask 11. Meanwhile, FIG. 3C shows, of the wiring pattern formed using only the halftone type phase mask 11, a portion being a so-called I-shaped pattern in which patterns are adjacent to each other with their tips facing to each other.

First, in order to know a relation between a local flare and a pattern size variation under the exposure conditions when using the halftone type phase shift mask 11, an exposure is performed using an experimental photomask 21 shown in FIGS. 4A to 4D.

The experimental photomask 21 has test patters A to C, . . . , D, and the respective patterns have a basic combinatorial configuration composed of a line pattern 1 and/or a zone pattern 2 of an orbicular zone shape that surrounds the line pattern 1 and forms a light transmitting region, as FIG. 1.

In this case, a test pattern "A" in FIG. 4A is composed only of the line pattern 1 being not affected by the flare, and the region within 100 μm from the line pattern 1 is completely shielded against light. A test pattern "B" in FIG. 4B is composed of the line pattern 1 and the zone pattern 2 arranging a light transmitting region of an orbicular shape having a inside diameter of 4.14 μm and an outside diameter of 6.89 μm so as to surround the line pattern 1, having no pattern except the zone pattern 2 in the region within such a distance from the line pattern 1 that requires to consider the effect of the local flare. A test pattern C in FIG. 4C is composed of the line pattern 1 and the zone pattern 2 arranging a light transmitting region of an orbicular shape having a inside diameter of 6.89 μm and an outside diameter of 9.65 μm so as to surround the line pattern 1, having no pattern except the zone pattern 2 in the region within such a distance from the line pattern 1 that requires to consider the effect of the local flare.

Thus, the respective zone patterns 2 are formed by having an inside diameter from 4.14 μm to 48.25 μm incrementally increasing by 2.76 μm, in which the inside diameter size of a zone pattern is adopted as the outside diameter size of the subsequent zone pattern, while constantly having a zone width of 2.76 μm. A test pattern D in FIG. 4D having the largest inside diameter here is composed of the line pattern 1 and the zone pattern 2 arranging a light transmitting region of an orbicular shape having an inside diameter of 48.25 μm and an outside diameter of 51.01 μm so as to surround the line pattern 1, and has no pattern except the zone pattern 2 in the region within such a distance from the line pattern 1 that requires to consider the effect of the local flare.

Figure 5:
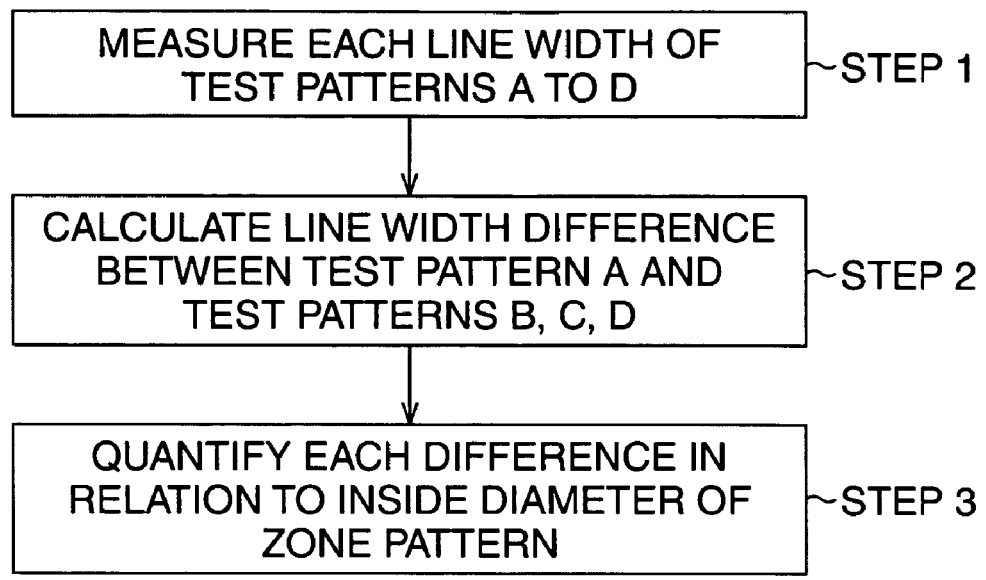
FIG. 5 is a flowchart when evaluating a local flare using the flare evaluation apparatus according to the present embodiment.

FIG. 5 is a flowchart when evaluating the local flare with a flare evaluation apparatus.

First, exposures are performed using the test patterns A to D in FIGS. 4A to 4D, and, after developing photoresists, the line widths of the respective line patterns 1 formed are measured, respectively (Step 1).

Secondarily, the measured line widths of the respective line patterns 1 of the test patterns B to D are compared to the measured line width of the line pattern 1 of the test pattern A, respectively, in this case, the difference between the line width of the line pattern 1 of the test pattern A and those of the test patterns B to D are obtained, respectively (Step 2). The differences are line width variations of the test patterns B to D caused by the local flare, in which a smaller difference indicates a smaller effect of the local flare on the line pattern 1, and, on the contrary, a larger difference indicates a larger effect of the local flare on the line pattern 1.

Then, the effect of the local flare on the respective zone patterns 2 of the test patterns B to D, namely the respective differences from the test pattern A are quantified with respect to the distance from the center portion of the line pattern 1 to the respective zone patterns 2, in this case, the inside diameters of the respective zone patterns 2 (Step 3).

Figure 6:
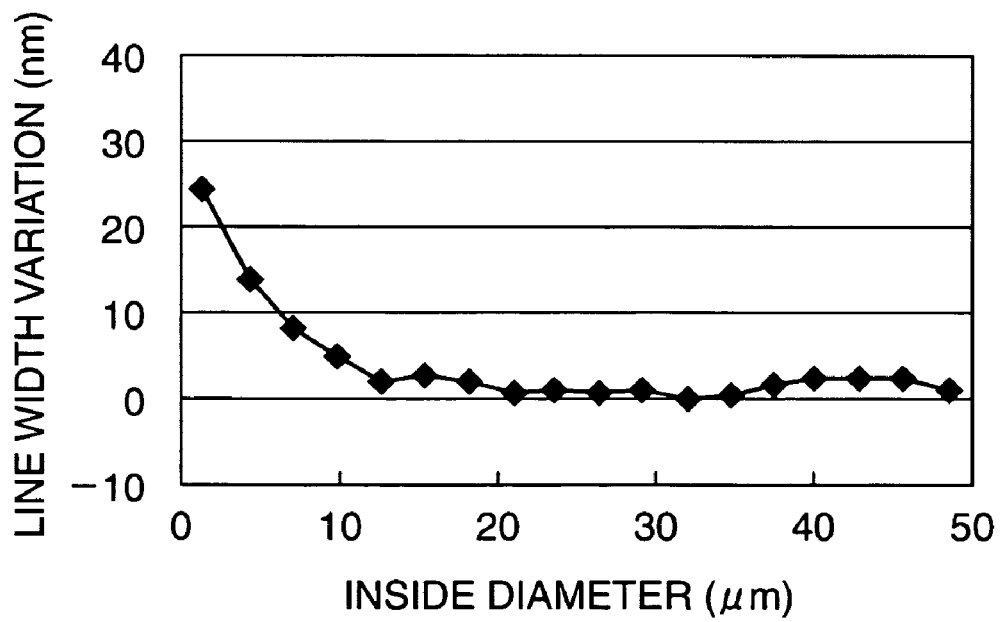
FIG. 6 is a characteristic chart showing a result in which a calculated relation between radii and difference values of the respective zone patterns are plotted.
Figure 7:
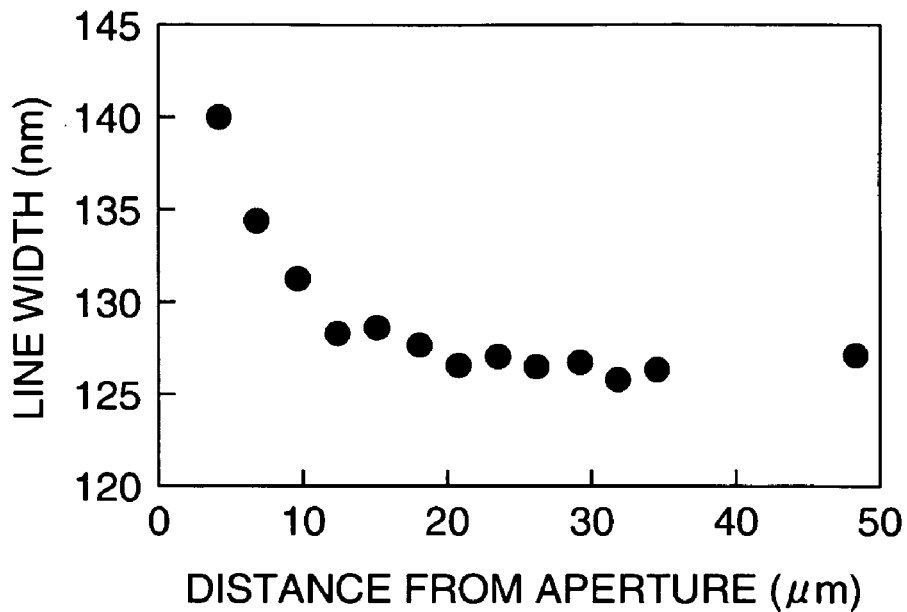
FIG. 7 is a characteristic chart showing a result in which a calculated relation between distances from line patterns 1 to respective zone patterns 2 and measured line widths are plotted.

Actually, the calculation result calculating the relation between the differences and the inside diameters of the respective zone patterns 2 are plotted in FIG. 6, and the relation between the distances from the line pattern 1 to the respective zone patterns 2 and the measured line widths are shown in FIG. 7, respectively.

Thus, it is found that the local flare has a large effect in the case of the zone patterns 2 of an inside diameter below approximately 12 μm, while the local flare scarcely has the effect in the case of those of an inside diameter over approximately 12 μm.

Note that the inside diameter of the zone pattern 2 is defined in the range from 4.14 μm to 48.25 μm here, however, the range may be appropriately chosen in each case, since the effective range of the flare differs depending on the aligner. Further, the zone width is defined as 2.76 μm here, whereas a smaller zone width allows more detail quantification of the effect of the local flare corresponding to the distance.

Here, it is assumed that the local flare intensity distribution of a beam of light is given in the form of the following Double-Gaussian distribution.

$$f(r) = A \left\{ \frac{1}{\sigma_1^2} \exp\left(-\frac{r^2}{2\sigma_1^2}\right) + \frac{B}{\sigma_2^2} \exp\left(-\frac{r^2}{2\sigma_2^2}\right) \right\} \quad (1)$$

r: Flare distance

Figure 8:
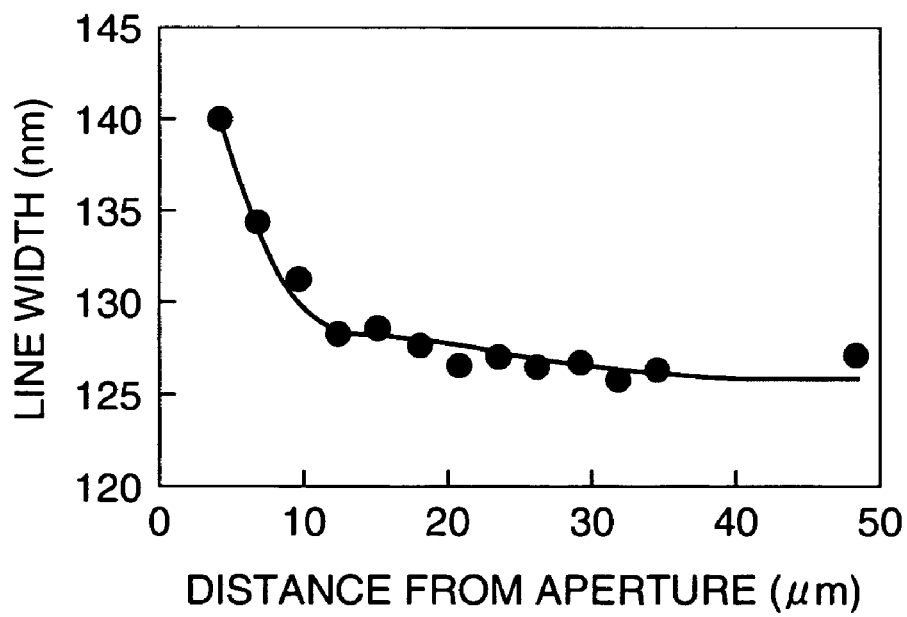
FIG. 8 is a characteristic chart showing a resultant integrated form of equation (1) which is fitted in the result in FIG. 7.

A: Numerical constant $\sigma_1$, $\sigma_2$: Gaussian distribution standard deviation B: Intensity ratio of Gaussian distribution The local flare amount of the respective test patterns shown in FIGS. 4A to 4D can be obtained by integrating the equation (1). FIG. 8 shows an integration and fitting result with respect to the result in FIG. 7. As shown in the drawing, the fitting result is favorable, letting us know that the intensity distribution of the local flare can be calculated accurately. Here, the example using the halftone type phase shift mask is presented, however, the same method is applicable as to the exposure conditions of the Levenson type phase shift mask in order to calculate the local flare intensity distribution.

Figure 9:
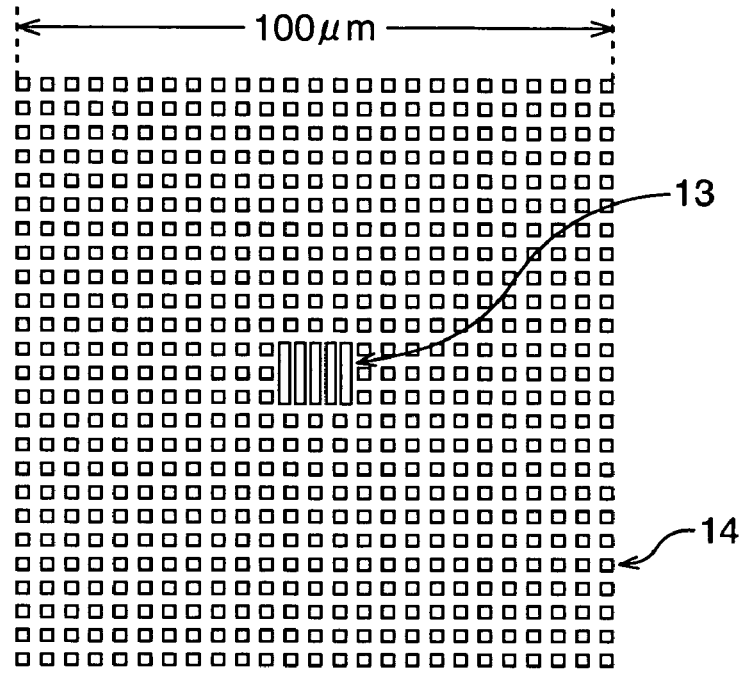
FIG. 9 is a schematic view showing an experimental photomask on which dummy patterns are arranged around the periphery of the respective patterns.
Figure 10:
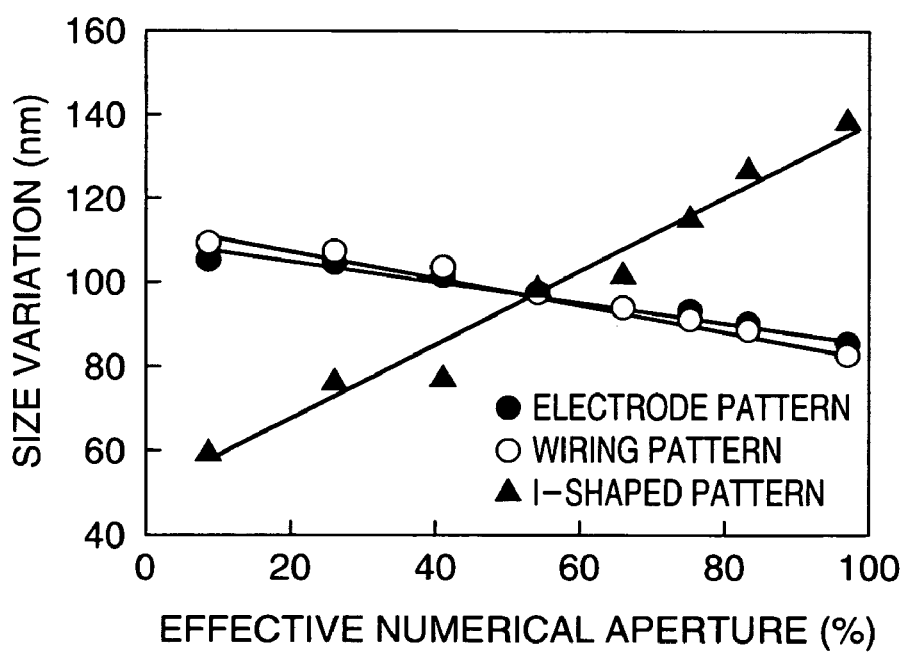
FIG. 10 is a characteristic chart showing a calculation result of a size variation of the pattern in relation to an effective numerical aperture in the case where the size of the dummy patterns of the experimental photomask is changed.

Subsequently, with a photomask of which surface is entirely the light transmitting portion, the equation (1) is ruled to produce "1" when integrated, and the integral value of the equation (1) is defined as an effective numerical aperture. Then, with the respective patterns in FIGS. 3A to 3C, a calculation is made to obtain the relation between the effective numerical aperture and the size variation. Here, as shown in FIG. 9, an experimental photomask 15 configured to have dummy patterns 14 arranged around the periphery of the respective patterns 13 is employed. With a variety types of experimental photomasks 15 having the dummy patterns of various regions, the size variation of the pattern 13 when changing the size of the dummy pattern of the halftone type phase shift mask is calculated with respect to the effective numerical aperture. The calculation result is shown in FIG. 10. As shown in the drawing, it is found that the effective numerical aperture and the size variation are substantially in a linear relation. Then, in FIGS. 3A, 3B, 3C, the slopes being linearly approximated were −0.23 nm/%, −0.31 nm/%, 0.90 nm/%, respectively.

Figure 11:
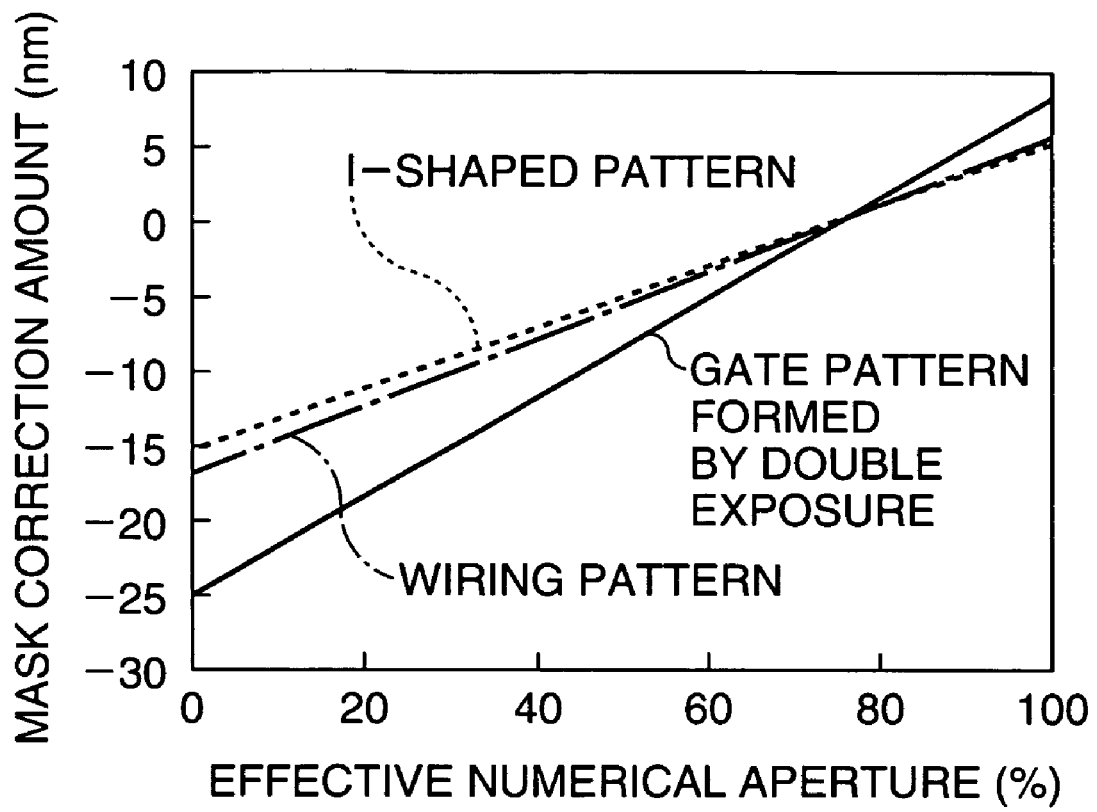
FIG. 11 is a characteristic chart to calculate a mask correction amount per a unit numerical aperture of the respective patterns.

Further, in the local flare correction of the pattern on an actual photomask, a so-called MEEF (Mask Error Enhancement Factor) representing a size variation of a resist pattern should be taken into consideration for the size variation of the pattern. A mask correction amount M per unit numerical aperture of the respective patterns in FIGS. 3A, 3B, 3C can be obtained by the equation below, M=size variation per unit numerical aperture of each pattern/MEEF The MEEFs of the respective patterns in FIGS. 3A, 3B, 3C are 0.69, 1.35, 4.38, respectively, in this order, so that the mask correction amounts M per unit numerical aperture of the respective patterns are 0.33 nm/%, 0.23 nm/%, 0.21 nm/%, respectively as shown in FIG. 11.

Thus, it is found that the gate wiring pattern and the I-shaped pattern have substantially a similar mask correction amount, while the gate electrode pattern formed by double exposure has a different mask correction amount. The gate electrode pattern is formed in the active region partitioned by an element isolation region, therefore, when exposing the actual pattern, whether a portion is doubly exposed or not can be known simply by checking whether the portion is the active portion or not.

Figure 12:
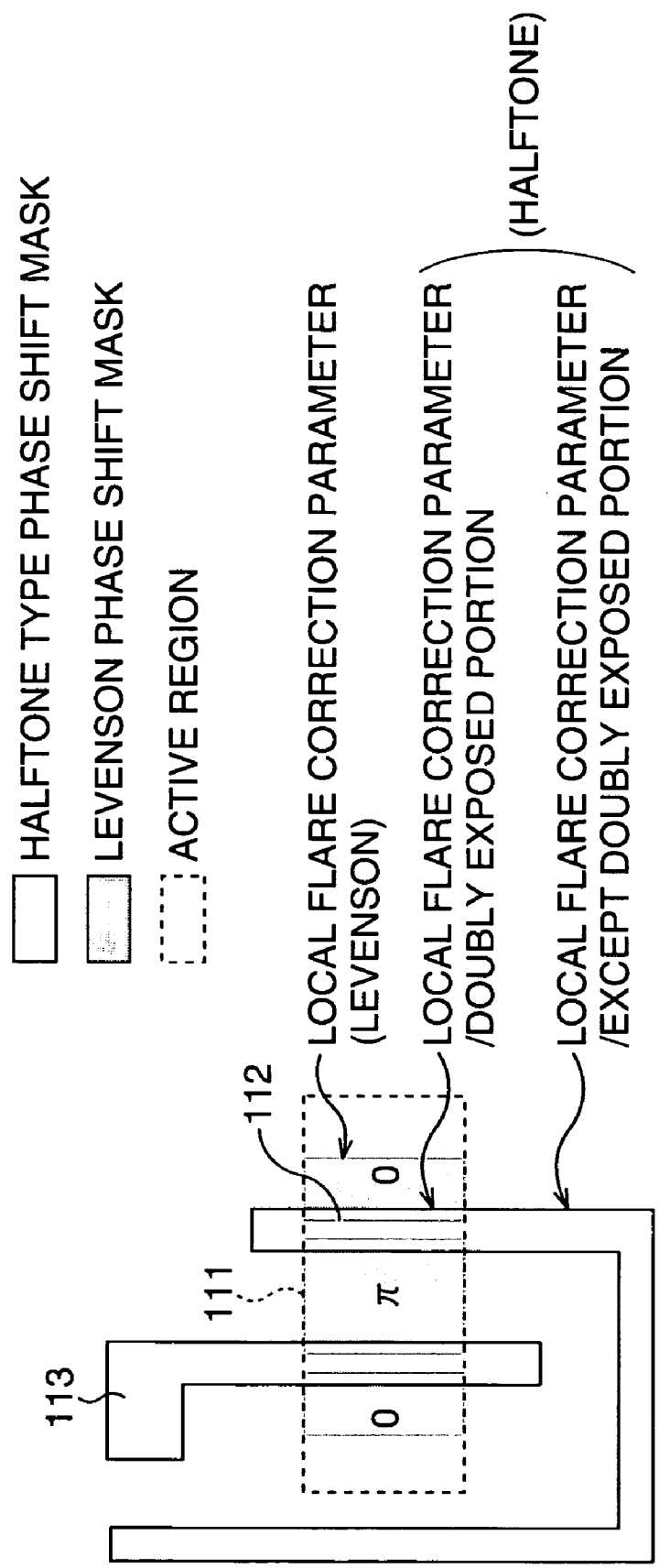
FIG. 12 is a schematic plan view showing a case where a gate electrode is formed by double exposure and a gate wiring is formed by single exposure, when forming a gate.

Specifically, as shown in FIG. 12, when the portion to be exposed is the active region 111, it is determined to be the portion (gate electrode pattern 112) to be exposed doubly using both the halftone type phase shift mask and the Levenson type phase shift mask, and a mask correction amount of approximately 0.33 nm/% is adopted thereto. Meanwhile, when the portion to be exposed is other than the active region (including the region on the element isolation region), it is determined to be the portion (gate wiring pattern 113) to be exposed once using only the halftone type phase shift mask, and a mask correction amount of approximately 0.21 nm/% to 0.23 nm/% is adopted thereto.

Figure 13A:
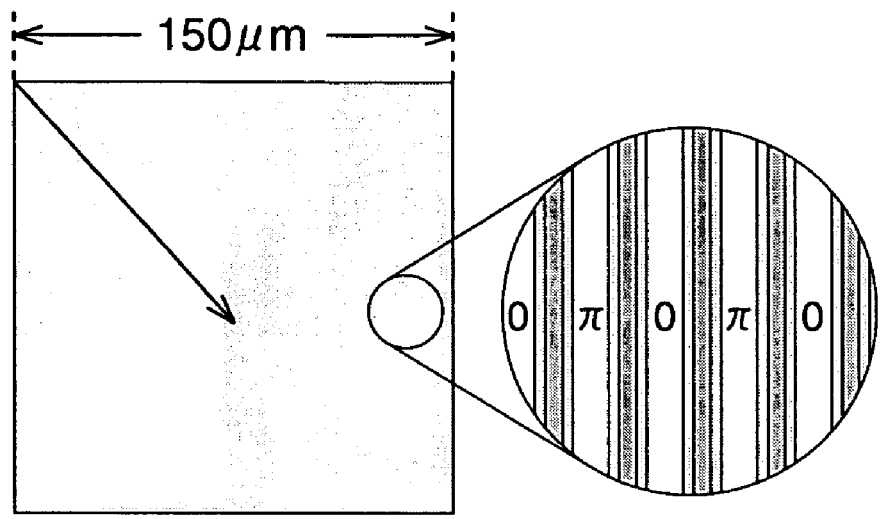
FIGS. 13A and 13B are schematic views showing an experimental example evaluating an effect brought about by the present embodiment.
Figure 13B:
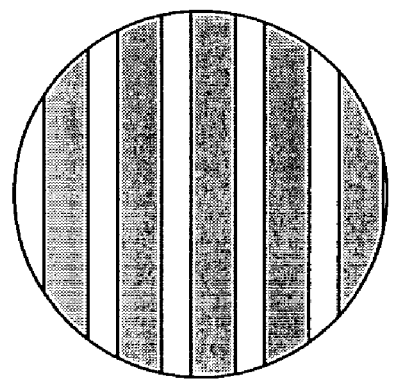

Here, an example experiment evaluating the effect brought about by the present embodiment will be described. In this case, as shown in FIG. 13, the line width variation is measured from a corner portion toward a center portion of a series of lines and spaces (L & S). The L & S formed by double exposure is denoted by (a) and the L & S formed by a single exposure is denoted by (b), respectively. The first exposure of (a) and the exposure of (b) are performed with the halftone type phase shift mask under the conditions of annular illumination=½ (lens diameter when illumination NA=0.595) and NA=0.7. The second exposure of (a) is performed with the Levenson type phase shift mask under the conditions of annular illumination=½ and NA=0.7. The periphery of the L & S is close to the aperture to thereby be strongly affected by the local flare.

Figure 14A:
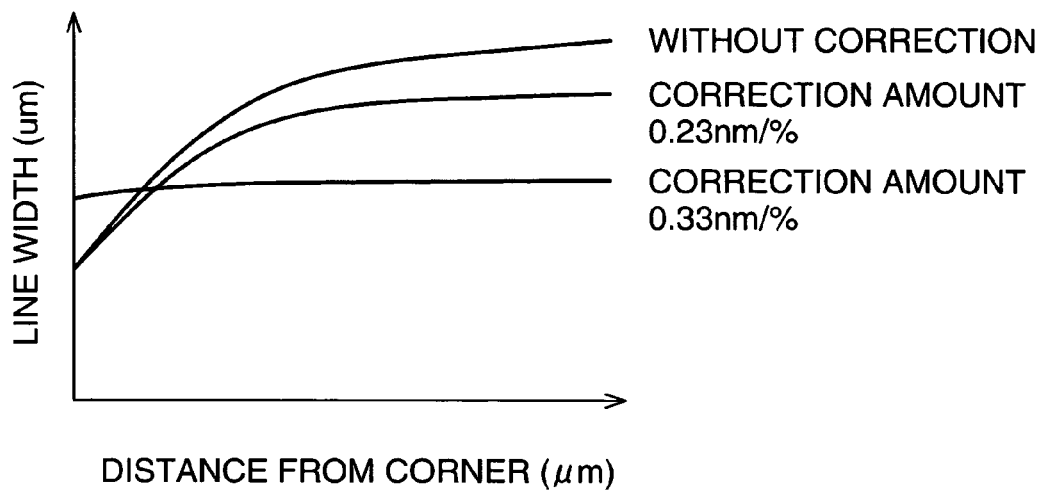
FIGS. 14A and 14B are characteristic views showing line width variations by local flare corrections on the basis of a comparison example.

FIG. 14A is a characteristic view showing the measurement result of the patterns of the (a) in FIG. 13.

This is a comparison result made between the cases where no local flare correction is made, where the optimum mask correction amount for double exposure is defined as 0.33 nm/%, and where the optimum mask correction amount for the exposure other than double exposure is defined as 0.23 nm/%. It is possible to confirm that the line width variation after the local flare correction is improved in size precision when the optimum mask correction amount for double exposure is defined as 0.33 nm/%.

Figure 14B:
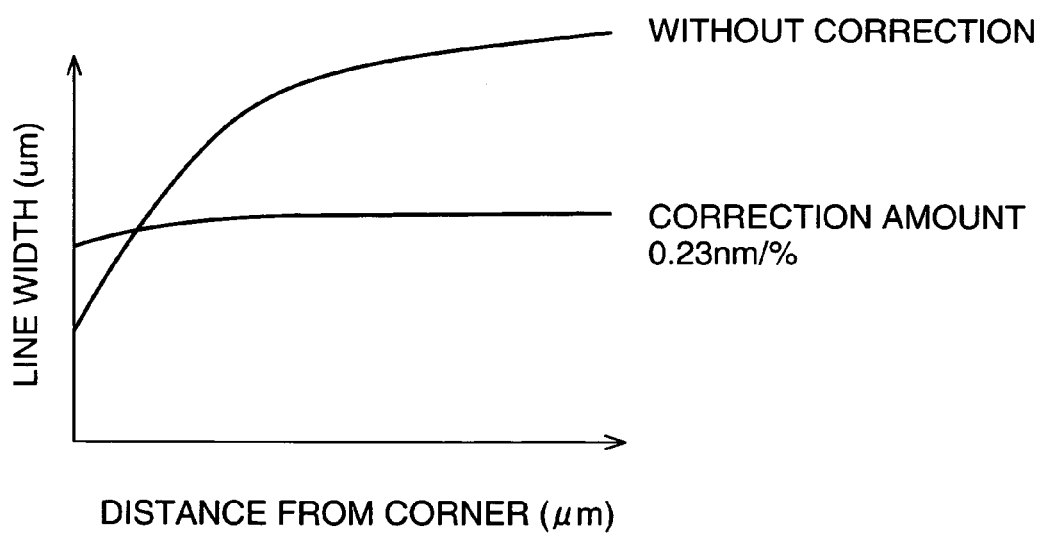

FIG. 14B is a characteristic view showing the measurement result of the patterns of the (b) in FIG. 13.

This is a comparison result made between the cases where no local flare correction is made and where the optimum mask correction amount for the exposure other than double exposure is defined as 0.23 nm/%. It is possible to confirm that the line width variation after the local flare correction is improved in size precision when the optimum mask correction amount for the exposure other than double exposure is defined as 0.23 nm/%.

(Specific Example of Local Flare Correction Apparatus and Correction Method)

Figure 15:
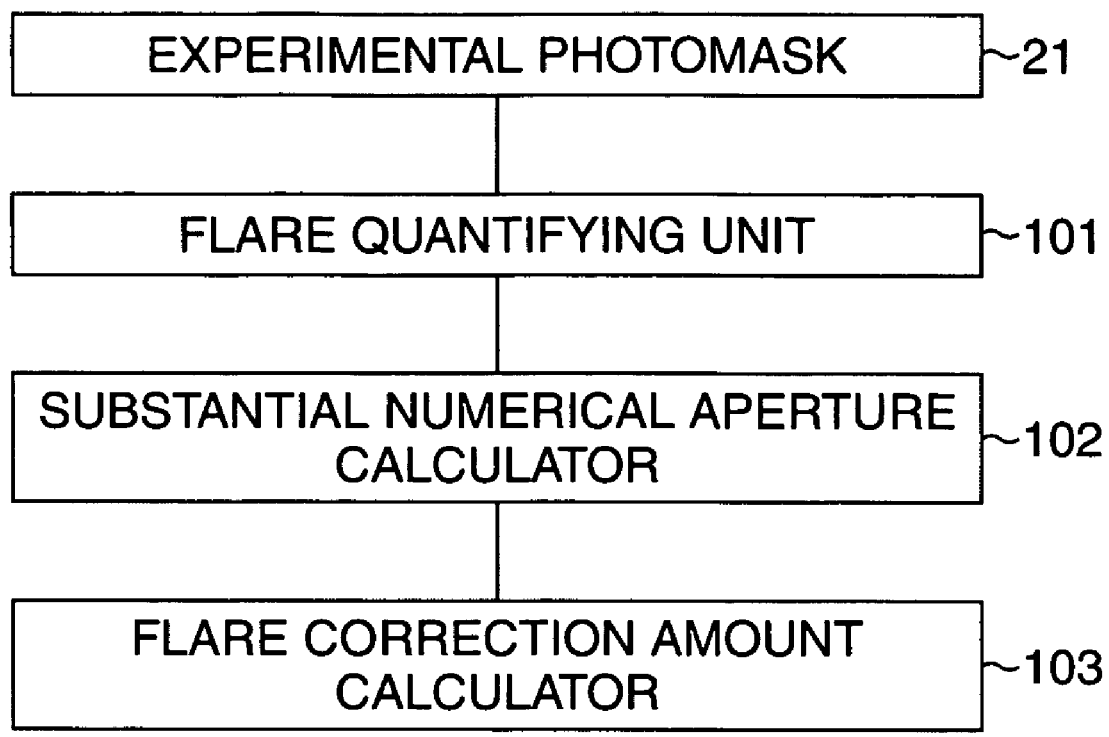
FIG. 15 is a block diagram showing a schematic configuration of a flare correction apparatus according to the present embodiment.

FIG. 15 is a block diagram showing a schematic configuration of a flare correction apparatus according to the present embodiment.

This flare correction apparatus is configured to include: an experimental photomask 21 having a test pattern as described above; a point spread function calculator 101 calculating, based on the measurement result of the experimental mask, a point spread function of the flare in conformity with the exposure conditions of the respective region to be exposed; a substantial numerical aperture calculator 102 calculating, for each region to be exposed, a substantial numerical aperture to an actual pattern of the each region; and a flare correction amount calculator 103 calculating the local flare correction amount of the actual pattern in each region in conformity with the substantial numerical aperture in the each region.

Figure 16:
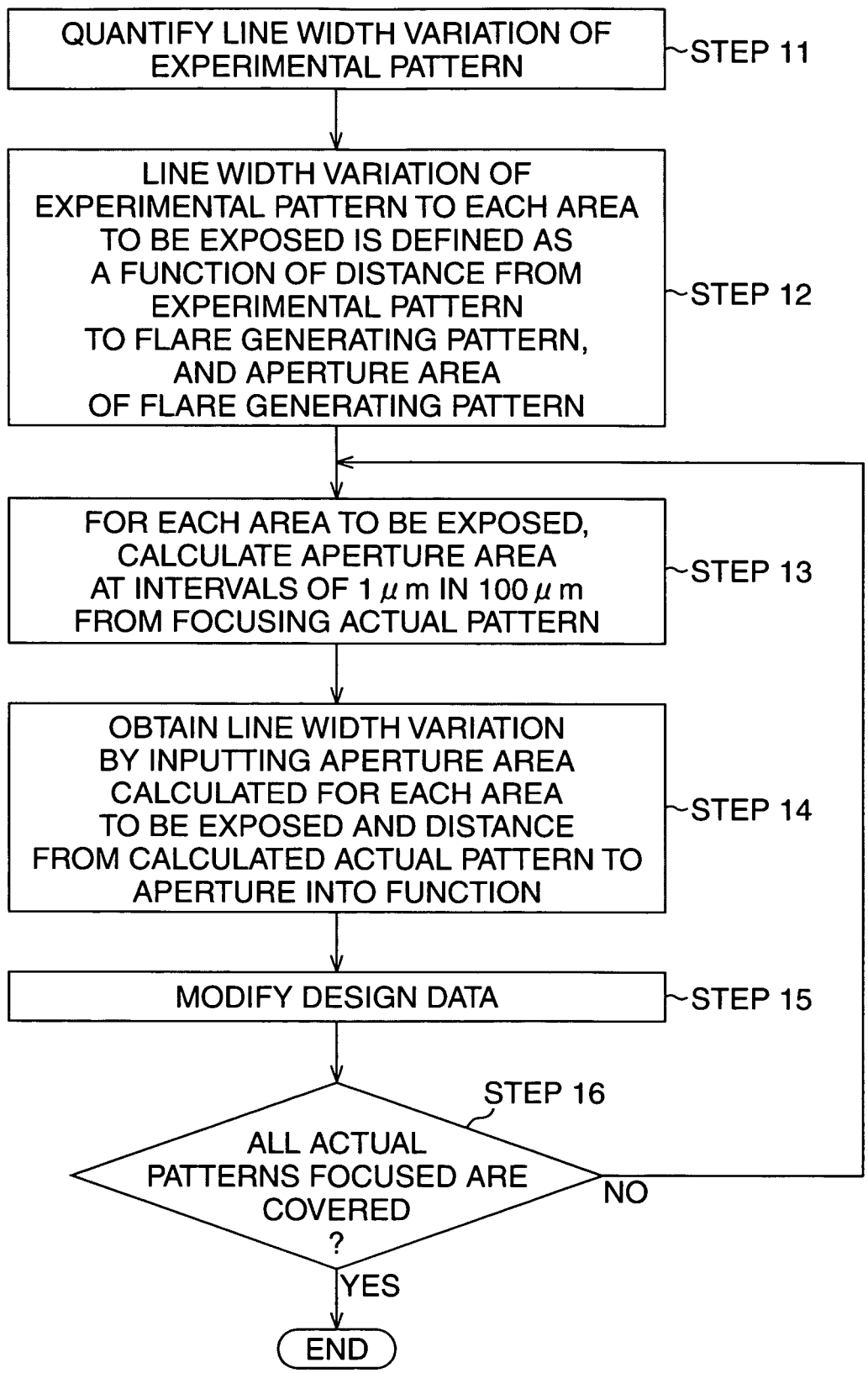
FIG. 16 is a flowchart to correct, using this flare correction apparatus, the effect of the local flare on an actual pattern when manufacturing a semiconductor device.

FIG. 16 is a flowchart to correct the effect of the local flare on the actual pattern when manufacturing a semiconductor device using the present correction apparatus.

Here, for the each region to be exposed, the local flare correction value is calculated in conformity with the exposure conditions in the each region. In the case of the above-described example, for the active region, the local flare correction amount is adjusted on the basis of the double exposure, and for the regions other than the active region, an adjustment is made in accordance therewith.

First, by Steps 1 to 3 previously described with reference to FIG. 5, with the use of the experimental photomask 21, the effect of the local flare on the line pattern 1 is quantified as the difference with respect to the distance between the center portion of the line pattern 1 and the respective zone patterns 2, namely the inside diameter of the respective zone patterns 2 (Step 11).

Subsequently, there is compiled a function or a table that indicates the measured line width variation of the line pattern 1 as the relation between the distance between the line pattern 1 and the zone pattern 2 and the opening region of the light transmitting region of the zone pattern 2 (the relation with the effective numerical aperture) (Step 12).

Subsequently, as for device patterns (actual patterns) actually formed, the substantial numerical aperture is calculated using the above-described function or table for a closely-watched actual pattern (Step 13). For instance, the opening region within a predetermined distance from the actual pattern is calculated, for example, here, the opening region is calculated at intervals of 1 μm in the region requiring to consider the effect of the local flare being within for example 100 μm from the actual pattern.

Subsequently, the calculated numerical aperture is applied to the function or table to obtain the line width variation of the actual pattern (Step 14).

Subsequently, based on the calculated line width of the actual pattern, the design data of the actual pattern is adjusted so as to approximate it to the line width measured only from the actual patterns as much as possible (Step 15).

With the adjusted function or table obtained in Step 13, Steps 14 to 16 are sequentially implemented to the plural actual patterns of the photomask to correct the effect of the local flare on the respective actual patterns of the photomask, so that the photomask is fabricated (Step 16).

As described above, according to the flare correction apparatus (method) of the present embodiment, the effect of the local flare on the pattern exposed in the photolithography is quantitatively corrected in conformity with the respective exposure conditions, allowing the formation of the desired pattern readily and accurately.

The respective equipment and means composing the flare correction apparatus and the respective steps (Steps 1 to 3 in FIG. 5 and Steps 11 to 16 in FIG. 16) of the flare correction method according to the above-described embodiment can be realized by operating a program recorded in a RAM or ROM of a computer. The program and a computer readable record media recording the program are within the scope of the present invention.

Specifically, the program is recorded in the record medium such as a CD-ROM, or provided to the computer via various transmission media. As a record medium recording the program, a flexible disk, a hard disk, a magnetic tape, a magneto-optical disk, a nonvolatile memory card, and the like can be used in addition to the CD-ROM. Meanwhile, as a transmission medium of the program, a communication medium (a wired circuit such as an optical fiber, a wireless circuit, or the like) in a computer network system (LAN, WAN such as the Internet, a wireless communication network, and the like) to supply the program information by propagating it as a signal carrier can be utilized.

Further, in addition to the case where the computer implements the supplied program to realize the function of the above-described embodiment, even in the cases where the program collaborates with an OS (operating system), the other application, or the like, which are operating in the computer, to realize the function of the above-described embodiment, and where all or parts of the processing of the supplied program are performed by a function expansion board or a function expansion unit of the computer to realize the function of the above-described embodiment, such programs are within the scope of the present invention.

Figure 17:
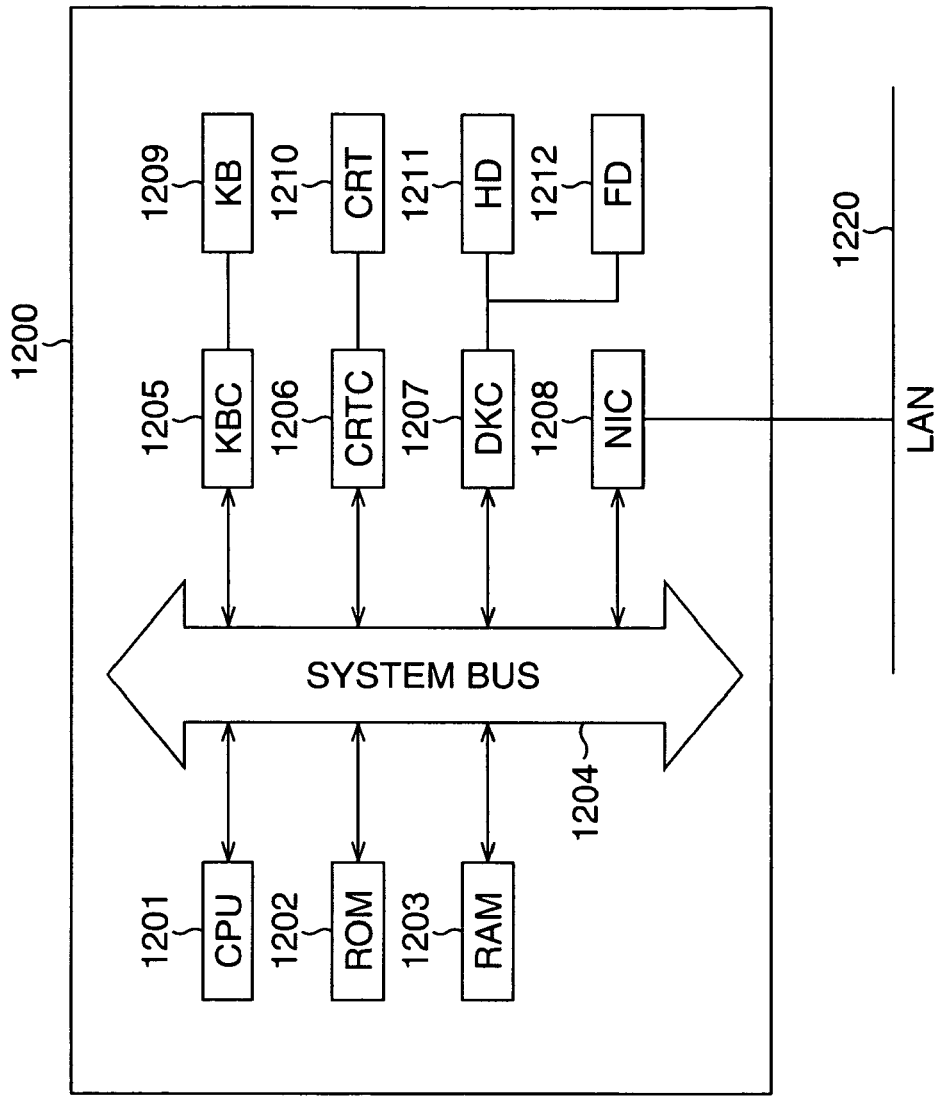
FIG. 17 is a schematic view showing an internal configuration of a terminal equipment for general personal users.
Figure 18:
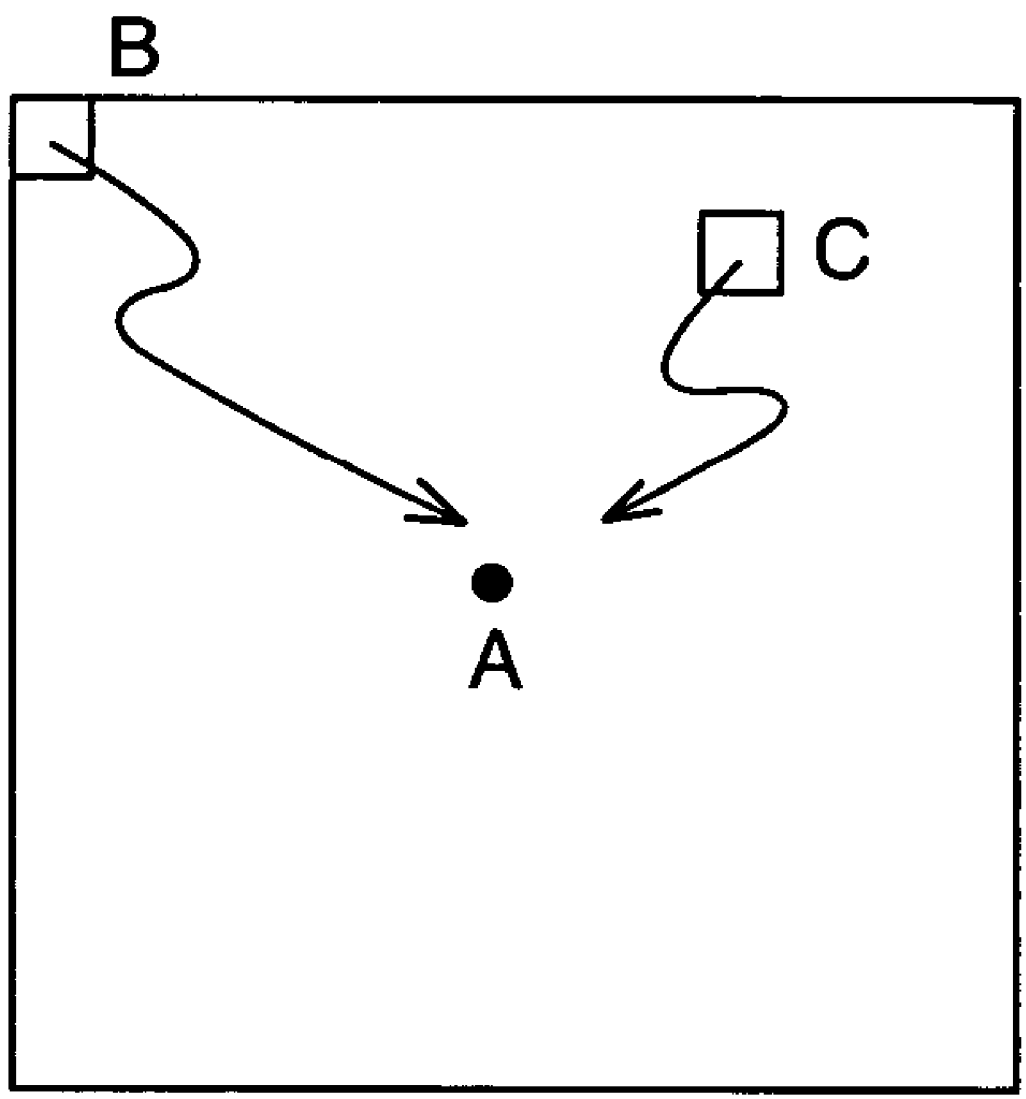
FIG. 18 is a schematic view to illustrate how the local flare is generated.

For instance, FIG. 17 is a schematic view showing an internal configuration of a general personal user terminal equipment. In FIG. 17, a personal computer (PC) is denoted by "1200". The PC 1200 includes a CPU 1201 and implements a device control software stored in a ROM 1202 or a hard disk (HD) 1211, or supplied by a flexible disk drive (FD) 1212, to comprehensively control the respective devices connected to a system bus 1204.

INDUSTRIAL APPLICABILITY

According to the present invention, an effect of a local flare on a pattern exposed in a photolithography is quantitatively corrected in conformity with respective exposure conditions, so that a desired pattern can be formed readily and accurately.

What is claimed is:

1. A flare correction method correcting a local flare generated at a time of exposure when manufacturing a semiconductor device, comprising the steps of:
   calculating an effective numerical aperture to a pattern in a region, for each region to be exposed; and
   calculating a correction amount of the flare of the pattern as a size variation ratio based on a relation between the effective numerical aperture and a size variation of the pattern for the each region to be exposed.

2. The flare correction method according to claim 1, wherein the each region is an active region and a nonactive region to be exposed.

3. A flare correction method correcting a local flare generated at a time of exposure when manufacturing a semiconductor device, comprising the steps of:
   calculating, in each region to be exposed, a point spread function of the flare by using an experimental mask to estimate the flare, on a basis of a measurement result of the experimental mask and in conformity with exposure conditions of the each region; and calculating, for each region to be exposed, a effective numerical aperture to a pattern in the each region based on a light intensity distribution of the flare; and calculating a flare correction amount for the pattern in the each region as a size variation ratio based on a relation between the effective numerical aperture and a size variation of the pattern for the each region to be exposed.

4. The flare correction method according to claim 3,
wherein the exposure conditions are an exposing number of times to the region and a type of a photomask.

5. The flare correction method according to claim 3,
wherein the each region is an active region and a nonactive region to be exposed.

6. The flare correction method according to claim 3,
wherein the experimental mask includes a pattern for measurement to be a flare estimation target, and a plurality of flare generating patterns forming light transmitting regions letting the pattern for measurement generate the flare and having different distances from the pattern for measurement.

7. The flare correction method according to claim 3,
wherein an mask for correction fabricated to conform the exposure conditions is used when calculating a correction value.

8. A manufacturing method of a photomask having an exposure pattern to be transferred by lithography, comprising the steps of:

calculating a numerical aperture to a pattern in a region, for each region to be exposed;

calculating a correction amount of flare generated at a time of exposure for the pattern in the each region, as a size variation ratio based on a relation between the effective numerical aperture and a size variation of the pattern for the each region to be exposed; and forming the exposure pattern based on the calculated correction amount.

9. The manufacturing method of the photomask according to claim 8,
wherein the each region is an active region and a nonactive region to be exposed.

10. A manufacturing method of a photomask having an exposure pattern to be transferred by lithography, comprising:

calculating, in each region to be exposed, a point spread function of the flare by using an experimental mask to estimate a local flare generated when transferring the exposure pattern, on a basis of a measurement result of the experimental mask and in conformity with exposure conditions of the each region;

calculating, for each region to be exposed, a effective numerical aperture to a pattern in the each region based on a light intensity distribution of the flare; and calculating a flare correction amount for the pattern in the each region as a size variation ratio based on a relation between the substantial numerical aperture effective numerical aperture and a size variation of the pattern for the each region to be exposed; and forming the exposure pattern based on the calculated correction amount.

11. The manufacturing method of the photomask according to claim 10,
wherein the each region is an active region and a nonactive region to be exposed.

12. A flare correction apparatus correcting a local flare generated at a time of exposure when manufacturing a semiconductor device comprising:

a point spread function calculator to calculate, in each region to be exposed, a point spread function of the flare by using an experimental mask to estimate the flare, on a basis of a measurement result of the experimental mask and in conformity with exposure conditions of the each region;

a effective numerical aperture calculator to calculate, for each region to be exposed, a effective numerical aperture to a pattern in the each region based on a light intensity distribution of the flare; and a flare correction amount calculator to calculate a flare correction amount for the pattern in the each region as a size variation ratio based on a relation between the effective numerical aperture and a size variation of the pattern for the each region to be exposed.

13. The flare correction apparatus according to claim 12,
wherein the exposure conditions are an exposing number of times to the region and a type of a photomask.

14. The flare correction apparatus according to claim 12,
wherein the each region is an active region and a nonactive region to be exposed.

15. The flare correction apparatus according to claim 12,
wherein the experimental mask includes a pattern for measurement to be a flare estimation target, and a plurality of flare generating patterns forming light transmitting regions letting the pattern for measurement generate the flare and having different distances from the pattern for measurement.

16. The flare correction apparatus according to claim 12,
wherein an mask for correction fabricated to conform the exposure conditions is used when calculating a correction value.

17. An exposure method to form a resist pattern on a semiconductor substrate comprising the steps of:

performing a first exposure to a first region and a second region on the semiconductor substrate; and performing a second exposure to the second region on the semiconductor substrate, wherein, in the second exposure step, a mask pattern is transferred to the second region after a step of correcting a size shift amount by a size variation ratio based on a relation between a effective numerical aperture to a pattern in the second region and a size variation of the pattern for the second region to be exposed.

18. The exposure method according to claim 17,
wherein the first shift amount is a shift amount correcting a local flare generated at a time of an exposure when manufacturing a semiconductor device.

19. The exposure method according to claim 17,
wherein the mask pattern includes a gate electrode pattern formed on an active region on the semiconductor substrate.

20. The exposure method according to claim 2,
wherein the pattern includes a gate electrode pattern formed on an active region and a gate wiring pattern formed on an active region.

* * * * *